United States Patent [19]

Flickinger

[11] 3,752,928

[45] Aug. 14, 1973

[54] AMPLIFIER SYSTEM UTILIZING REGENERATIVE AND DEGENERATIVE FEEDBACK TO SHAPE THE FREQUENCY RESPONSE

[76] Inventor: Daniel N. Flickinger, 40 S. Oviatt St., Box 628, Hudson, Ohio

[22] Filed: Mar. 4, 1971

[21] Appl. No.: 120,875

[52] U.S. Cl. .................. 179/1 A, 179/1 F, 179/1 D, 330/103, 330/109, 330/126

[51] Int. Cl. .................. H03j 5/24

[58] Field of Search .................. 179/1 D, 1 F, 1 A, 179/1 FS, 1 P; 330/103, 104, 109, 126, 31, 84, 85, 99, 100; 333/14, 17

[56] References Cited

UNITED STATES PATENTS

| | | | |
|---|---|---|---|
| 3,566,294 | 2/1971 | Takahashi | 330/103 |
| 3,356,962 | 12/1967 | Morgan | 330/103 |
| 2,173,427 | 9/1939 | Scott | 330/109 |
| 1,559,869 | 11/1925 | Hartley | 330/103 |
| 2,672,529 | 3/1954 | Villard | 330/104 |
| 2,178,072 | 10/1939 | Fritzinger | 330/109 |
| 3,624,298 | 11/1971 | Davis | 179/1 D |
| 3,643,173 | 2/1972 | Whitten | 330/109 |
| 3,466,559 | 9/1969 | Ruby | 330/109 |

OTHER PUBLICATIONS

Buscher, Computers in Audio Design, Audio March 1961, p. 22–24.

*Primary Examiner*—Kathleen H. Claffy
*Assistant Examiner*—Jon Bradford Leaheey
*Attorney*—Woodling, Krost, Granger & Rust

[57] ABSTRACT

An amplifier system is disclosed having a plurality of frequency sensitive band amplifiers to shape the frequency response of the amplifier system. The band amplifiers use active filters to amplify or attenuate sections of bandwidth of the amplifier system and band amplifiers are only required for the sections of the bandwidth to be altered. The amplifier system is suitable for use with an audio amplifier system to reinforce or attenuate the acoustical output of the audio system to compensate for speaker performance and room acoustics. The foregoing abstract is merely a resume of one general application, is not a complete discussion of all principles of operation or applications, and is not to be construed as a limitation on the scope of the claimed subject matter.

16 Claims, 7 Drawing Figures

INVENTOR.
DANIEL N. FLICKINGER
BY Woodling, Krost, Granger and Rust
ATTORNEYS.

INVENTOR.
DANIEL N. FLICKINGER
BY Woodling, Krost, Granger and Rust
ATTORNEYS.

AMPLIFIER SYSTEM UTILIZING REGENERATIVE AND DEGENERATIVE FEEDBACK TO SHAPE THE FREQUENCY RESPONSE

BACKGROUND OF THE INVENTION

The past decade has produced unprecedented advances in the art of construction of solid state amplifiers. Solid state amplifiers are now available having a uniform gain over a wide bandwidth with low distortion and at a minimum cost. The versatility of these solid state amplifiers effected the advent of matching the frequency response of an amplifier system to the application of the system. This matching was accomplished by dividing the bandwidth of an amplifier system into bandwidth sections and independently controlling the gain of each section. Thus, the frequency response of the amplifier system could be altered by varying the output of the various bandwidth sections. The bandwidth of the amplifier system was divided into bandwidth sections through the use of either passive filter networks or active filter networks. The passive filter networks had the disadvantage of exhibiting ringing properties and the active filter networks generally turned out to be expensive.

The use of passive and active filters to shape the frequency response of an amplifier system was of special interest to those in the field of audio amplifier systems. It is very desirable to be able to shape the frequency response of an audio amplifier system to compensate for the acoustics of a room and deficiencies in acoustical transducers. When the frequency response of an audio amplifier system is properly shaped, variations in acoustical output caused by room acoustics are compensated resulting in a uniform acoustical output at a given point within a room. However, the prior art amplifier systems attempting to shape the frequency response using either passive or active filters failed to produce a high quality amplifier system at a reasonable cost.

The amplifier systems that use passive filters have many disadvantages. These systems are able only to attenutate the signal. Thus all bandwidth sections must be attenuated to the bandwidth section having the lowest output. This necessitates the use of a large power amplifier. Since all bandwidth sections must be attenuated to the bandwidth section having the lowest output, a filter for each and every section of the bandwidth must be present. Passive filters exhibit ringing properties and have a high degree of distortion. Passive filters are also highly inductive making them unstable and tending to oscillate.

The amplifier systems using active filters have the disadvantage of being expensive in relation to passive filters. Any amplifier system requiring an active filter for each and every section of the bandwidth of the amplifier system is almost economically unfeasible. These amplifier systems also exhibited instability when a significant number of active filters were required to adequately shape the frequency response. In addition, the insertion of these filters tended to change the overall characteristics of the entire amplifier system.

Accordingly, an object of this invention is to produce an amplifier system using all active filters thus eliminating the ringing properties associated with inductive components.

Another object of this invention is to produce an amplifier system to either amplify or attenuate the output of a given bandwidth section.

Another object of this invention is to produce an amplifier system which requires active filters only for the bandwidth sections of interest.

Another object of this invention is to produce an amplifier system with a variable frequency response at an inexpensive price.

Another object of this invention is to produce an amplifier system with low intermodulation distortion.

Another object of this invention is to produce an amplifier system with high signal to noise ratio.

Another object of this invention is to produce an amplifier system which is stable.

SUMMARY OF THE INVENTION

The invention may be incorporated in an amplifier system comprising, in combination, an input, an output, a master amplifier having an input means and an output means, gain control means for said master amplifier, a plurality of band amplifiers each having an input and an output terminal, said band amplifiers each being responsive to a given bandwidth section, regenerative and degenerative feedback means, means connecting said output means to said output, means connecting said input means to said input, means connecting said feedback means to said input means, means connecting each of said input terminals of said band amplifiers to one of said means of said master amplifier, and means connecting each of said output terminals of said band amplifiers to one of said feedback means.

Other objects and a fuller understanding of the invention may be had by referring to the following description and claims, taken in conjunction with the accompanying drawing.

DESCRIPTION OF DRAWINGS

Figure 1:
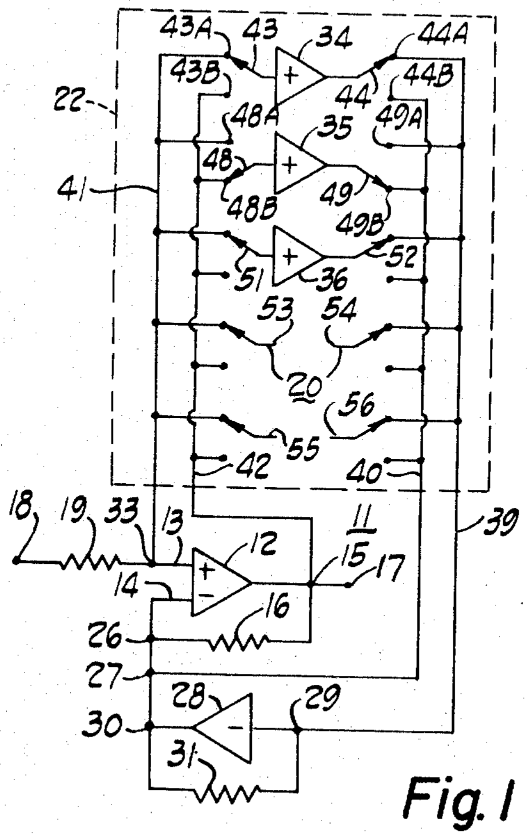
FIG. 1 is an amplifier system incorporating the present invention.

FIG. 1 illustrates a somewhat simplified version of the preferred embodiment of the invention. This FIG. 1 illustrates an amplifier system 11 which incorporates the invention by having a means to amplify a given band or audio band, shown as a master amplifier 12. Where this amplifier is used to amplify audio signals, the ambient may have different affects on different portions of the total bandwidth, to attenuate certain portions and to accentuate other portions. Accordingly, the invention provides a means to compensate for such variations in the ambient and provides regenerative means to increase the amplification of selected discrete band sections each of less band width than the given audio band. Also degenerative means is provided to reduce the amplification of selected discrete band sections each of less band width than the given audio band. This regenerative and degenerative means is provided by a band amplifier system 22. The band amplifier system 22 further includes selectable means to select one of the regenerative and degenerative means for a particular one of the band sections. This selectable means may include switch means 20.

The amplifier system 11 as an entire system has an input 18 and an output 17. The master amplifier 12 has input terminals 13 and 14 and an output terminal 15. There is means connecting the input terminal 13, which is a non-inverting terminal, to the input 18 of the entire system 11. This means includes an input resistor 19. There is means connecting the output terminal 15 of the master amplifier 12 to the output 17 of the entire system and this is shown in FIG. 1 as being a direct connection.

The band amplifier system 22 is so connected to the system 11 so that it provides the regenerative or degenerative means. In this FIG. 1 it is shown as providing regenerative or degenerative feedback means. The term feedback is used as a general term in this disclosure and includes taking signal from an input of an amplifier, processing the signal and feeding the signal back to the input. To accomplish this, the switch means 20 establishes the connection as either regenerative or degenerative feedback. The switch means 20 provides a means connecting each of the output terminals of these band amplifiers 34–36 to one of the regenerative or degenerative feedback means. The switch means 20 includes a group of first switches such as 43, 48 and 51 connected to the inputs of the band amplifiers. This switch means 20 further includes a group of second switches such as 44, 49 and 52 which are connected to the outputs of these band amplifiers 34–36.

The master amplifier 12 is a differential amplifier which has both the non-inverting terminal 13 and an inverting terminal 14. A feedback resistor 16 is also connected from the output back into the inverting terminal 14 to control the gain of amplifier 12 in combination with the input resistor 19. This master amplifier 12 may be typically characterized as a wideband, low distortion solid state amplifier. This master amplifier also has a high open loop gain and a substantially uniform frequency response. Where used with audio amplifier systems, the substantially uniform frequency response would cover the entire audio band and preferably beyond it, for example, from 20 Hz to 20,000 Hz.

The amplifier system 11 also includes a first inverting amplifier 28 which is a part of the means connecting the output terminals of the band amplifiers 34–36 to one of the feedback means. In the circuit of FIG. 1, this first inverting amplifier 28 is connected in the circuit only when a particular band amplifier 34–36 is desired to be used in the amplification mode as distinguished from the attenuation mode.

The amplifier system 11 has a means to separate the regenerative and degenerative means to prevent interference and to improve isolation. This means to separate the regenerative and degenerative means is provided for both the input and output of the band amplifier system 22 which provides the regenerative and degenerative means. The regenerative means includes the band amplifiers 34–36 when connected by the switch means 20 in the amplification mode and connected to a peaking conductor 41. When the band amplifiers 34–36 are connected by the switch means 20 to an attenuation conductor 42, they are connected in the attenuation mode. The conductors 41 and 42 are connected to opposite ends of amplifier means; namely, they are connected to the input and output, respectively, of the master amplifier 12.

The outputs of the regenerative and degenerative are also separated to improve isolation in a similar manner. When the outputs of the band amplifiers 34–36 are connected by the switch means 20 to a peaking conductor 39, they are connected in the amplification mode. When the outputs are connected to an attenuation conductor 40, they are connected in an attenuation mode. These two conductors 39 and 40 are connected to opposite ends; namely, to the input and output of amplifier means. This is shown in FIG. 1 as the first inverting amplifier 28. The band amplifier system 22 is composed of a plurality of band amplifiers shown as 34, 35, and 36. The band amplifiers are non-inverting amplifiers and each amplifier passes a given frequency bandwidth section which is within the bandwidth of the master amplifier 12. The bandwidth section of each of the band amplifiers is a small portion of the bandwidth of the master amplifier 12. Each band amplifier has a first and a second switch connected, respectively, to the input and the output of the band amplifier. The band amplifier 34 has the first switch 43 and the second switch 44. The band amplifier 35 has the first switch 48 and the second switch 49, and the band amplifier 36 has the first switch 51 and the second switch 52. Each of the first switches has an amplification contact and an attenuation contact. The amplification contacts for switches 43 and 48 are 43A and 48A, respectively. The attenuation contacts for the first switches 43 and 48 are 43B and 48B, respectively. Likewise, each of the second switches 44, 49 and 52 has an amplification contact and an attenuation contact. The amplification contacts for the second switches 44 and 49 are 44A and 49A, respectively; and the attenuation contacts for the second switches are 44B and 49B. Thus, when the first and second switches are in the upward position, as shown for the band amplifier 34, each of the first and second switches is in the amplification contact position. When the first and second switches are in the downward position, as shown for the band amplifier 35, each of the first and second switches is in the attenuation contact position. The first and second switches of band amplifier 36 are shown in the amplification contact position. The position of the first and second switches of a given band amplifier determines whether the amplifier will either be in an amplification mode or an attenuation mode. The contacts of the first switches are connected to either an input or an output terminal of the master amplifier 12. The contacts of the second switches are connected either directly to the inverting terminal 14 or to the inverting terminal through a first inverting amplifier 28. In FIG. 1, the contacts are shown connected in the following way. The amplification contacts of the first switches are connected through the conductor 41 to the non-inverting terminal 13 at a connection point 33. The attenuation contacts of the first switches are connected through the conductor 42 to the output terminal 15 of the master amplifier 12. The amplification contacts of the second switches are connected through the conductor 39 to an input 29 of the first inverting amplifier 28. The attenuation contacts of the second switches are connected through the conductor 40 to a connection point 27 which is connected to the inverting terminal 14 of the master amplifier 12. An output 30 of the first inverting amplifier 28 is connected to the inverting terminal 14 of the master amplifier 12. A feedback resistor 31 controls the gain of the first inverting amplifier 28 and typically maintains the first inverting amplifier at a unity gain mode of operation.

The master amplifier 12 has a uniform frequency response and will amplify an entire band of signals applied to the input 18. An amplified version of these signals will appear at the output terminal 15 and at the output 17. The master amplifier is individually capable of amplifying signals from input 18 to the output 17 in a uniform manner for all frequencies within the bandwidth. If the gain in a bandwidth section or band section of the master amplifier 12 needs to be increased or decresed, this change in gain can readily be accomplished through the use of the band amplifier system 22. If a band section is to be amplified, then a band amplifier 34 having a bandpass equal to that bandwidth section will be inserted into the band amplifier system. The first and second switches 43 and 44 of the band amplifier 34 will be moved to the amplification contact positions 43A and 44A, respectively. The signals present at the non-inverting terminal 13 are also present at the input of the band amplifier 34. The band amplifier 34 amplifies only the frequencies within the bandwidth section in question and returns those amplified signals to the input 29 of the first inverting amplifier 28. The inverted amplified signals of this bandwidth section are applied to the inverting terminal 14 from the output 30 of the first inverting amplifier 28. In this position, the gain of the master amplifier in this bandwidth section is increased. If the same bandwidth section is to be attenuated, then the first and second switches 43 and 44 of the band amplifier 34 would be moved into the attenuation contact position and the output of the band amplifier 34 would be returned directly to the inverting terminal 14 through the conductor 40. In this position, the gain of the master amplifier 12 in this bandwidth section is reduced. Thus, by moving switches 43 and 44 of the band amplifier 34, the corresponding bandwidth section can be amplified or attenuated depending upon the position of the switches. Similarly, a second bandwidth section corresponding to the bandpass of the band amplifier 35 can be attenuated or amplified depending upon position of the first and second switches 48 and 49, respectively. If band amplifiers are absent, as illustrated by the open switches 53–56, the gain in these bandwidth sections is determined by resistors 16 and 19. The band amplifiers are required only for the bandwidth sections of interest. The bandwidth sections of interest being those bandwidth sections which are to be amplified or attenuated.

The band amplifier system 22 shown in FIG. 1 has provisions for a plurality of band amplifiers, with five being shown. The first and third band amplifiers 34 and 36, respectively are in the amplification position and the second band amplifier 35 is in the attenuation position. In this illustration, it was not necessary to use a fourth or a fifth band amplifier. This illustrates that band amplifiers are only required for the bandwidth sections to be altered. The bandwidth of master amplifier 12 will have a uniform gain with the exception of the bandwidth sections of the band amplifiers 34 and 36 which will be amplified and the bandwidth section of the band amplifier 35 which will be attenuated. The arrangement as shown in FIG. 1 can be used with zero band amplifiers or with an unlimited number of band amplifiers covering the entire bandwidth of the master amplifier. In this illustration, provisions for only five band amplifiers are shown. In an actual application of this circuit, provisions for a great deal more band amplifiers would be usually provided in the equipment. For example, in an audio amplifier application, it would not be unusual to have provisions for 30 band amplifiers.

In an amplifier system constructed by the inventor according to the invention, sockets for 30 band amplifiers were provided in the system. Each band amplifier was mounted on a circuit board which could be plugged into one of the sockets. The band amplifiers had a one-third active bandwidth with a gain of 10 decibels. The master amplifier had a gain of 20 decibels.

An amplifier system as described in FIG. 1, can be constructed without the use of actual switches by providing two sets of sockets. One set of sockets would be connected in the attenuation mode and the other connected in the amplification mode. The proper placement of a given band amplifier in one of the appropriate sets of sockets is a selectable means to select either attenuation or amplification and broadly is an alternative switch means.

Figure 2:
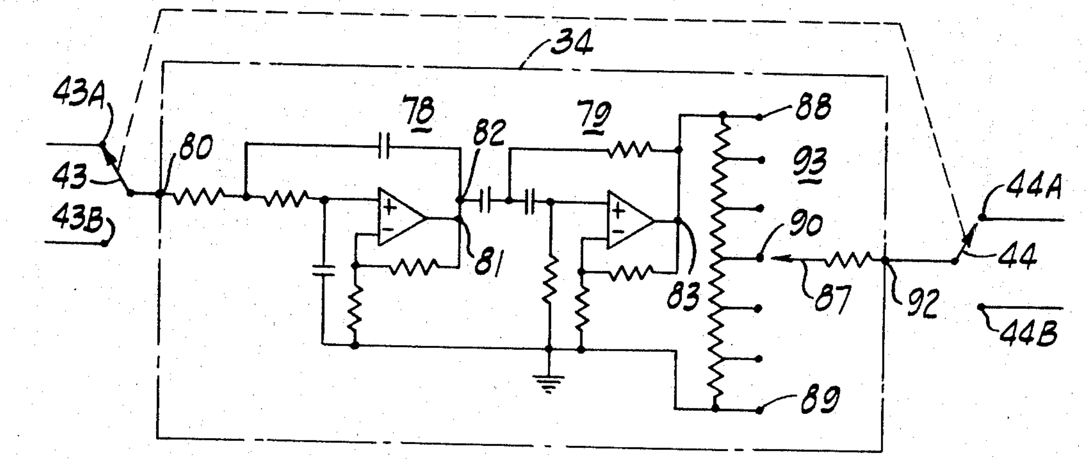
FIG. 2 is an example of the type of active filters that are suitable for use with the invention shown in FIG. 1.

FIG. 2 shows an example of the internal construction of a band amplifier which is suitable for the use with the invention shown in FIG. 1. The band amplifier in FIG. 2 represents the band amplifier 34 shown in FIG. 1. An input of the band amplifier 80 is connected to the first switch 43 and an output 92 of the band amplifier 34 is connected to the second switch 44. In FIG. 2, the first and second switches 43 and 44 are ganged to faciltate the change of operating mode of the band amplifier.

The band amplifier 34 is composed of a low pass active filter shown generally as 78, a high pass active filter shown generally as 79 and an attenuator shown generally as 93. The first switch 43 is connected to the input 80 of the low pass active filter 78. The output 81 of the low pass active filter 78 is connected to an input 82 of the high pass active filter 79. The output 83 of the high pass active filter 79 is connected to the attenuator 93. The pass bands of filters 78 and 79 overlap slightly to establish the pass band of the entire band amplifier 34. An amplified signal from the low and high pass active filters 78 and 79, respectively, is located between terminals 88 and 89. The movement of an attenuator arm 87 determines the amplitude of the signal into the second switch 44. If the attenuator arm 87 is moved into contact with the terminal 88, the maximum signal will be present at switch 44. The amplitude of the signal is one-half of the maximum at terminal 90. The amplitude of the bandwidth section is adjusted to control the amount of attenuation or amplification of the master amplifier 12. Each of the band amplifiers is constructed in a manner similar to the band amplifier 34 shown in FIG. 2. However, the resistive and capacitive components of each of the low pass and high pass filters are altered to change the bandpass for each of the band amplifiers. The active filters 78 and 79 have no inductive components and approach the behavior of an ideal filter. The objectionable ringing properties of passive filters are eliminated by the use of this configuration.

The active filters shown as 78 and 79 are not the only type of active filters that are applicable for use with this invention. FIG. 2 merely illustrates the internal function of the band amplifiers for use with this invention. Any active means to select a band of frequencies and to vary the output is within the definition of a band amplifier.

Figure 3:
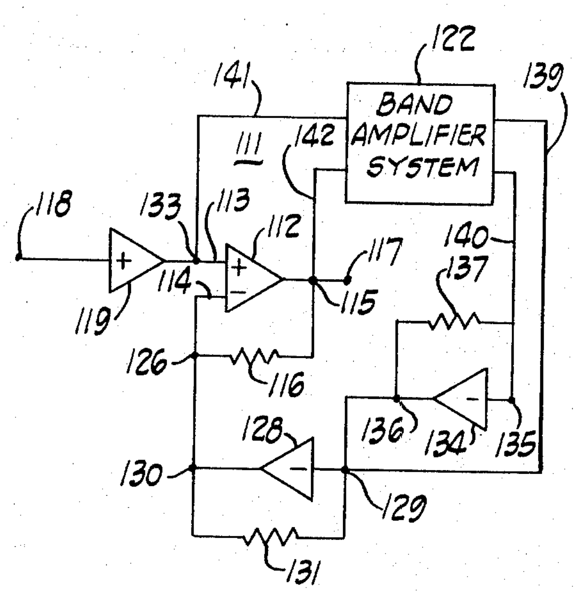
FIG. 3 is a schematic diagram of the preferred embodiment of the invention shown in FIG. 1.

FIG. 3 schematically illustrates a preferred embodiment of the invention shown in the simpler circuit of FIG. 1. FIG. 3 illustrates an amplifier system shown generally as 111 containing a master amplifier 112, a band amplifier system 122 and a first inverting amplifier 128. These amplifiers are arranged in a manner similar to the corresponding amplifiers shown in FIG. 1. The master amplifier 112 has a differential input having a non-inverting terminal 113 and an inverting terminal 114. A feedback resistor 116 is connected between an output terminal 115 and the inverting terminal 114. The band amplifier system 122 is shown in FIG. 3 as a rectangle for the sake of simplicity. However, this amplifier system 122 contains all the components within the band amplifier system 22 in FIG. 1. The noninverting terminal 113 is connected to the band amplifier system 122 by a conductor 141. The output 115 is connected to the band amplifier system by a conductor 142. The conductor 141 connects to the amplification contacts of the first switches and the conductor 142 connects to the attenuation contacts of the first switches in the same manner as conductors 41 and 42 in FIG. 1. A conductor 139 connects to the amplification contacts of the second switches and a conductor 140 connects to the attenuation contacts of the second switches in the same manner as conductors 39 and 40 in FIG. 1. The conductor 139 is connected to an input 129 of the first inverting amplifier 128. An output 130 of the first inverting amplifier is connected to the inverting terminal 114 of the master amplifier 112. A feedback resistor 131 controls the gain of the first inverting amplifier 128. The conductor 140 is connected to an input 135 of a second inverting amplifier 134. An output 136 of the second inverting amplifier 134 is connected to the input 129 of the first inverting amplifier 128. A feedback resistor 137 controls the gain of the second inverting amplifier 134. An input terminal 118 is connected to the non-inverting terminal 113 through a buffer amplifier 119. The output terminal 115 of master amplifier 112 is connected to the output 117.

The amplifier circuit 111 shown in FIG. 3 operates in a manner similar to the amplifier circuit shown in FIG. 1. The switches in the band amplifier system control the function of a given band amplifier to either amplify or attenuate a band-width section of the bandwidth of the master amplifier 112. The amplifier system in FIG. 3 contains several refinements over the amplifier system shown in FIG. 1, but both of the amplifier circuits operate in a very similar manner. The first refinement shown in FIG. 3 is the addition of the buffer amplifier 119. This buffer amplifier isolates the entire amplifier system from the input 118. The input impedance at input 118 can vary depending upon the number of band amplifiers inserted into the band amplifier system. If the band amplifier system contains a substantial number of band amplifiers, the reduced impedance at input 118 may be sufficient to load the source supplying a signal to the input 118. A resistor 19 was used in FIG. 1 to isolate the input 18 from the non-inverting terminal 13 of the master amplifier 12. In FIG. 3, the buffer amplifier 119 is used to isolate the input 118 from the non-inverting terminal 113 of the master amplifier 112. The buffer amplifier 119 also insures that there will be sufficient power to drive the band amplifier system and increases the overall stability of the amplifier system. A second refinement of the amplifier system shown in FIG. 3 over that of the amplifier system shown in FIG. 1 is the addition of the second inverting amplifier 134. The conductor 140 connects the attenuation contacts of the second switches in the band amplifier system to the input terminal 135 of the second inverting amplifier 134. In FIG. 1, the corresponding conductor 40 is directly connected to the inverting terminal 14 of master amplifier 12. The output terminal 136 of the second inverting amplifier is connected to the input 129 of the first inverting amplifier 128. Whereas the attenuation contacts of the second switches were connected directly to the inverting terminal 14 in FIG. 1, the attenuation contacts in FIG. 3 are connected to the inverting terminal through two inverting amplifiers 134 and 128. This increases the isolation of the band amplifier system from the master amplifier. In FIG. 1, the band amplifiers connected in the attenuation mode are effectively connected in parallel with the resistor 16. The presence of a large number of band amplifiers operating in the attenuation mode could under certain circumstances change the overall characteristics of the master amplifier 12. The refinements shown in FIG. 3 eliminate the problems encountered in certain applications of the invention. The amplifier systems shown in FIGS. 1 and 3 both illustrate the disclosed invention and are both useful and operative circuits. However, FIG. 3 contains additional refinements which are necessary under certain applications.

Figure 4:
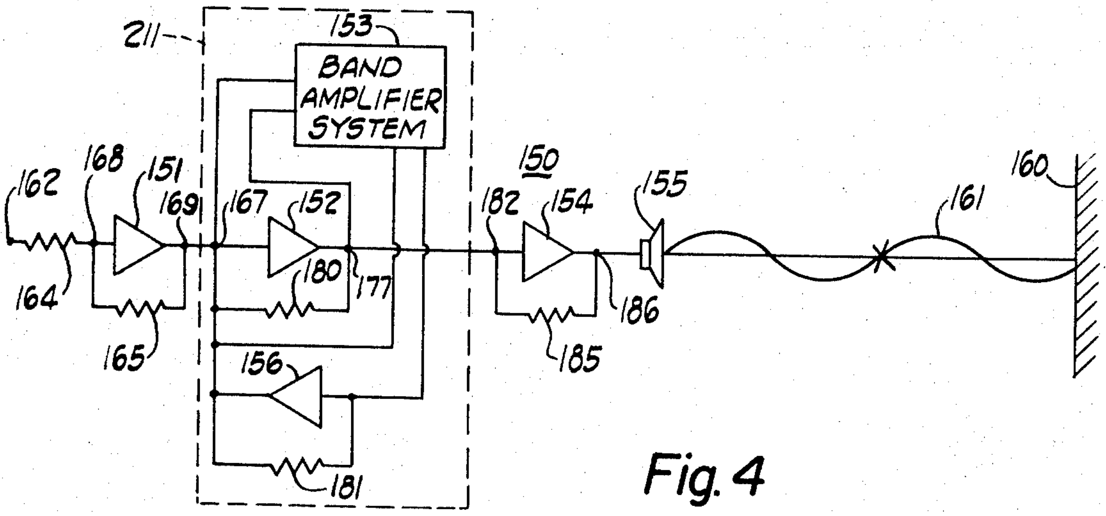
FIG. 4 is an example of an application of the invention in which the amplifier system is incorporated into an audio amplifier system.

FIG. 4 shows the invention as illustrated in FIG. 1 incorporated into an audio amplifier system 150. The audio amplifier system 150 includes a pre-amplifier 151, the amplifier system 211, a power amplifier 154 and an electro-acoustic transducer or speaker 155. The pre-amplifier 151 and the power amplifier 154 each have feedback resistors 165 and 185, respectively, to control the gain of the amplifiers. An input 168 of the pre-amplifier is connected through a resistor 164 to an input 162. An output 186 of the power amplifier 154 is connected to the speaker 155. The amplifier system 211 is connected between the pre-amplifier 151 and the power amplifier 154. The amplifier system is composed of a master amplifier 152, a band amplifying system 153 and a first inverting amplifier 156. This amplifier system is connected and operates in a manner identical to the circuit shown and described in FIG. 1. An outut 169 of the pre-amplifier 151 is connected to an input terminal 167 of master amplifier 152. An output terminal 177 of master amplifier 152 is connected to an input terminal 182 of the power amplifier 154.

When a signal is applied to input 162, an acoustical output, represented by the wave 161, is produced by the speaker 155. An audio amplifier system of this type is generally operated in an environment which has acoustics. The acoustics in this illustration are represented by the structure 160. A listener situated at point "X" within the environment will not experience a uniform acoustical output irrespective of the fact that transducer 155 is producing a uniform acoustical output. This anomaly is caused by a number of phenomena including interference, standing wave resonance, and selective reflection and absorption. These phenomena are intrinsic within the acoustical ambient. An objective of this invention is to alter the frequency response of an audio system to compensate for these acoustical phenomena.

Figures 5, 5A, 5B:
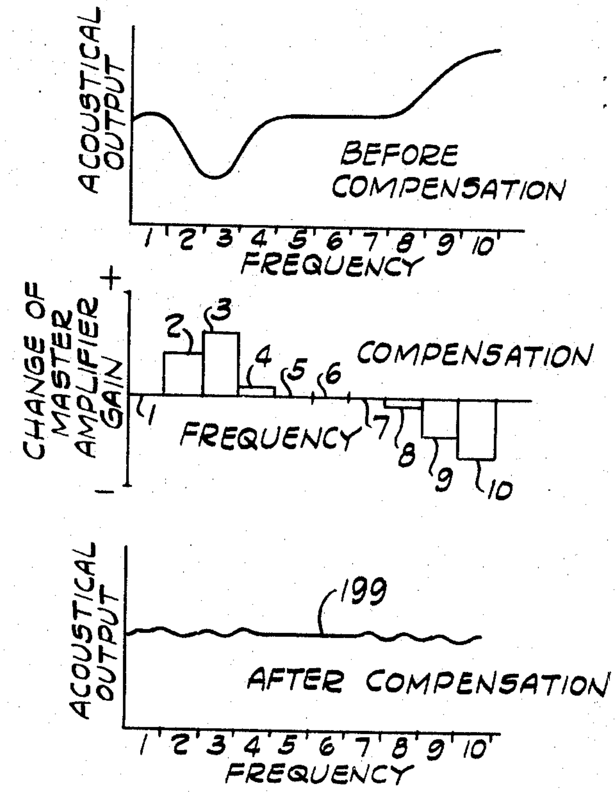
FIG. 5 is a graph of the acoustical output of the audio system in FIG. 4 at point X before compensation.
FIG. 5A is a graph of the change in frequency response of the amplifier system in FIG. 4.
FIG. 5B is a graph of the acoustical output of the audio system in FIG. 4 at point X after compensation.

FIG. 5 shows a graph of the acoustical output as a function of frequency of the audio amplifier system shown in FIG. 4. The graph was made at point "X" before compensation. Without compensation, there are no band amplifiers within the band amplifier system and the master amplifier 112 has a uniform frequency response. An output curve 192 exhibits an attenuated output 194 and a reinforced output 195. The lack of uniformity is a result of the acoustical phenomena previously described. The abscissa of the graph in FIG. 5 is the output frequency and this axis has been sectioned off into ten bandwidth sections. If the acoustical output level of point 196 on curve 192 is selected as the average acoustical output, then bandwidth sections 2, 3, 4, 8, 9 and 10 will require band amplifiers for compensation. FIG. 5A shows a graph of the change in gain of the master amplifier as a function of frequency. The magnitude of the ordinate of a bandwidth section represents the signal level from the band amplifier. An ordinate above the abscissa axis indicates the band amplifier is operating in the amplification mode whereas an ordinate below the abscissa axis indicates an attenuation mode of operation. The bandwidth sections 1, 5, 6, and 7 do not require any compensation and the gain of the master amplifier in these sections will be unaltered. The gain of the master amplifier requires an increase in the bandwidth sections 2, 3 and 4. Consequently, three band amplifiers each sensitive to one of these three bandwidth sections are inserted into the band amplifier system and the attenuator of each of the band amplifiers is adjusted to the amplitude as shown as the ordinate of the blocks 2, 3 and 4 in FIG. 5A. Three additional band amplifiers are required for bandwidth sections 8, 9 and 10. These band amplifiers will be operating in the attenuation mode, and the attenuator of each band amplifier will be set according to the ordinate as shown by the blocks 8, 9 and 10 in FIG. 5A. The addition of the six band amplifiers, three operating in the attenuation mode and three operating in the amplification mode, produces a substantially uniform acoustical output. FIG. 5B shows a graph of the acoustical output as a function of frequency at pont "X" in FIG. 4 after compensation. The curve 199 shows a substantially uniform acoustical output. The amplifier system has compensated for the acoustics of the ambient. This is an example of the process of shaping the frequency response of the master amplifier 152 to the application of the amplifier system.

The process of shaping the frequency response of an amplifier system as described in this invention, has advanced the art of amplifier systems in many ways. First of all, each band amplifier is capable of amplifying or attenuating the output relative to an average value. Secondly, band amplifiers are required only for the bands of interest, in FIGS. 5 and 5A bands 2, 3, 4, 8, 9 and 10. Since band amplifiers are required only for the bands of interest, the price of such an amplifier system is greatly reduced. In addition, by using active filters, the amplifier system can be constructed to have low intermodulation distortion, a high signal to noise ratio and high stability.

Although the amplifier system is ideally suited for use with an audio amplifier system, this is not to be construed as a limitation on the amplifier system. A fundamental characteristic of this amplifier system is versatility; and to limit the invention to audio applications would be against the spirit of this invention.

The present disclosure inclues that contained in the appended claims, as well as that of the foregoing description. Although this invention has been described in its preferred form with a certain degree of particularity, it is understood that the present disclosure of the preferred form has been made only by way of example and that numerous changes in the details of the circuit and the combination and arrangement of circuit elements may be resorted to without departing from the spirit and scope of the invention as hereinafter claimed.

What is claimed is:

1. An amplifier system comprising, in combination:
an input,
an output,
a master amplifier having an input means and an output means,
gain control means for said master amplifier,
a plurality of band amplifiers each having an input and an output terminal,
said band amplifiers each being responsive to a given bandwidth section,
regenerative and degenerative means,
means connecting said output means to said output,
means connecting said input means to said input,
means connecting said regenerative and degenerative means to said input means,
means connecting each of said input terminals of said band amplifiers to one of said input and output means of said master amplifier,
and means connecting each of said output terminals of said band amplifiers to one of said regenerative or degenerative means.

2. An amplifier system as set forth in claim 1, wherein each of said band amplifiers includes an active band filter and variable signal output means.

3. An amplifier system as set forth in claim 1, wherein said means connecting said input means to said input includes a buffer amplifier.

4. An amplifier system as set forth in claim 1, wherein said means connecting each of said input terminals of said band amplifiers to one of said input and output means of said master amplifier includes first switch means,
and said means connecting each of said output terminals of said band amplifiers to one of said regenerative and degenerative means includes second switch means.

5. An amplifier system as set forth in claim 1, wherein one of said regenerative and degenerative means includes a first inverting amplifier.

6. An amplifier system as set forth in claim 1, wherein one of said regenerative and degenerative means includes a first inverting amplifier and the other of said regenerative and degenerative means includes said first inverting amplifier and a second inverting amplifier.

7. An amplifier system as set forth in claim 1, wherein each of said band amplifiers includes a low pass amplifier filter, a high pass amplifier filter and an attenuator.

8. An amplifier system as set forth in claim 1, wherein said input means of said master amplifier includes a differential input having a non-inverting terminal and an inverting terminal, said means connecting said input to said input means includes means connecting said input to one of said non-inverting and inverting terminals, and said means connecting said regenerative and degenerative means to said input means includes means connecting said regenerative and degenerative means to the other of said noninverting and inverting terminals.

9. An amplifier system as set forth in claim 1, wherein said input means of said master amplifier includes a differential input having a non-inverting terminal and an inverting terminal, said band amplifiers are non-inverting amplifiers, said band amplifiers each having first and second switch means, said switch means each having an amplification contact and an attenuation contact, said means connecting each of said input terminals of said band amplifiers to one of said input and output means includes means connecting said amplification contacts of said first switch means to said non-inverting terminal and also includes means connecting said attenuation contacts of said first switch means to said output means, said means connecting each of said output terminals of said band amplifiers to one of said regenerative and degenerative means includes means connecting said amplification contacts of said second switch means to said regenerative means and also includes means connecting said attenuation contacts of said second switch means to said degenerative means.

10. An audio amplifier system to produce an acoustical output in an ambient environment having acoustical properties, comprising in combination, a pre-amplifier, a power amplifier, an electro-acoustical transducer, a master amplifier having a bandwidth with a substantially uniform gain, a plurality of band amplifiers each being responsive to a given bandwidth section of said bandwidth, means connecting said power amplifier to said transducer, means connecting said master amplifier to said power amplifier, means connecting said master amplifier to said pre-amplifier, and regenerative and degenerative means connecting said band amplifiers to said master amplifier to selectively amplify or attenuate certain bandwidth sections of the gain of said master amplifier to reinforce or attenuate an acoustical output of said transducer in accordance with the acoustical properties of the ambient environment.

11. An amplifier system as set forth in claim 10, wherein each of said band amplifiers varies the gain in a given bandwidth section and the number of band amplifiers required is equal to the number of bandwidth sections to be varied.

12. An audio amplifier system to produce an acoustical output in an ambient environment having acoustical properties, comprising in combination, a master amplifier having a given bandwidth, a plurality of band amplifiers responsive to a bandwidth section of said given bandwidth, an electro-acoustical transducer, means connecting said master amplifier to said transducer, and means connecting said band amplifiers to said master amplifier for amplifying and attenuating the acoustical output of the system in accordance with the acoustical properties of the ambient environment.

13. An audio amplifier system as set forth in claim 12, wherein said means connecting said band amplifiers to said master amplifier includes degenerative and regenerative means.

14. An audio amplifier system comprising in combination, means to amplify a given audio band, regenerative means to provide increased amplification of a plurality of selected discrete band sections each of less bandwidth than said given audio band, degenerative means to provide reduced amplification of a plurality of selected discrete band sections each of less bandwidth than said given audio band, and selectable means to select one of said regenerative and degenerative means for particular ones of said plurality of band sections.

15. An amplifier system as set forth in claim 14, including active filter means connected as a part of said regenerative and degenerative means.

16. An amplifier system as set forth in claim 14, wherein said regenerative and degenerative means each has an input and an output and including means to separate the input of the regenerative means from the input of the degenerative means by connections to opposite ends of amplifier means.

* * * * *